United States Patent
Ranade et al.

(10) Patent No.: US 8,404,551 B2
(45) Date of Patent: Mar. 26, 2013

(54) SOURCE/DRAIN EXTENSION CONTROL FOR ADVANCED TRANSISTORS

(75) Inventors: Pushkar Ranade, Los Gatos, CA (US);
Lucian Shifren, San Jose, CA (US);
Sachin R. Sonkusale, Los Gatos, CA (US)

(73) Assignee: Suvolta, Inc., Los Gatos, CA (US)

( * ) Notice: Subject to any disclaimer, the term of this patent is extended or adjusted under 35 U.S.C. 154(b) by 82 days.

(21) Appl. No.: 12/960,289

(22) Filed: Dec. 3, 2010

(65) Prior Publication Data

US 2012/0139051 A1    Jun. 7, 2012

(51) Int. Cl.
  *H01L 21/336*  (2006.01)
  *H01L 21/70*  (2006.01)
  *H01L 29/02*  (2006.01)

(52) U.S. Cl. .................... 438/290; 257/368; 257/402

(58) Field of Classification Search .............. 438/290; 257/368, 402
See application file for complete search history.

(56) References Cited

U.S. PATENT DOCUMENTS

| | | |
|---|---|---|
| 3,958,266 A | 5/1976 | Athanas |
| 4,000,504 A | 12/1976 | Berger |
| 4,021,835 A | 5/1977 | Etoh et al. |
| 4,242,691 A | 12/1980 | Kotani et al. |
| 4,276,095 A | 6/1981 | Beilstein, Jr. et al. |
| 4,315,781 A | 2/1982 | Henderson |
| 4,518,926 A | 5/1985 | Swanson |
| 4,559,091 A | 12/1985 | Allen et al. |
| 4,578,128 A | 3/1986 | Mundt et al. |
| 4,617,066 A | 10/1986 | Vasudev |
| 4,662,061 A | 5/1987 | Malhi |
| 4,761,384 A | 8/1988 | Neppl et al. |
| 4,780,748 A | 10/1988 | Cunningham et al. |
| 4,819,043 A | 4/1989 | Yazawa et al. |
| 4,885,477 A | 12/1989 | Bird et al. |
| 4,908,681 A | 3/1990 | Nishida et al. |
| 4,945,254 A | 7/1990 | Robbins |
| 4,956,311 A | 9/1990 | Liou et al. |
| 5,034,337 A | 7/1991 | Mosher et al. |

(Continued)

FOREIGN PATENT DOCUMENTS

| | | |
|---|---|---|
| EP | 0274278 | 7/1988 |
| EP | 0312237 | 4/1989 |

(Continued)

OTHER PUBLICATIONS

Komaragiri, R. et al., "Depletion-Free Poly Gate Electrode Architecture for Sub 100 Nanometer CMOS Devices with High-K Gate Dielectrics", IEEE IEDM Tech Dig., San Francisco CA, 833-836, Dec. 13-15, 2004.

(Continued)

*Primary Examiner* — Charles Garber
*Assistant Examiner* — Calvin Choi
(74) *Attorney, Agent, or Firm* — Baker Botts L.L.P.

(57) ABSTRACT

A planar transistor with improved performance has a source and a drain on a semiconductor substrate that includes a substantially undoped channel extending between the source and the drain. A gate is positioned over the substantially undoped channel on the substrate. Implanted source/drain extensions contact the source and the drain, with the implanted source/drain extensions having a dopant concentration of less than about $1 \times 10^{19}$ atoms/cm$^3$, or alternatively, less than one-quarter the dopant concentration of the source and the drain.

11 Claims, 3 Drawing Sheets

U.S. PATENT DOCUMENTS

| | | | |
|---|---|---|---|
| 5,144,378 A | 9/1992 | Hikosaka | |
| 5,156,989 A | 10/1992 | Williams et al. | |
| 5,156,990 A | 10/1992 | Mitchell | |
| 5,166,765 A | 11/1992 | Lee et al. | |
| 5,208,473 A | 5/1993 | Komori et al. | |
| 5,294,821 A | 3/1994 | Iwamatsu | |
| 5,298,763 A | 3/1994 | Shen et al. | |
| 5,369,288 A | 11/1994 | Usuki | |
| 5,373,186 A | 12/1994 | Schubert et al. | |
| 5,384,476 A | 1/1995 | Nishizawa et al. | |
| 5,426,328 A | 6/1995 | Yilmaz et al. | |
| 5,444,008 A | 8/1995 | Han et al. | |
| 5,552,332 A | 9/1996 | Tseng et al. | |
| 5,559,368 A | 9/1996 | Hu et al. | |
| 5,608,253 A | 3/1997 | Liu et al. | |
| 5,622,880 A | 4/1997 | Burr et al. | |
| 5,624,863 A | 4/1997 | Helm et al. | |
| 5,625,568 A | 4/1997 | Edwards et al. | |
| 5,641,980 A | 6/1997 | Yamaguchi et al. | |
| 5,663,583 A | 9/1997 | Matloubian et al. | |
| 5,712,501 A * | 1/1998 | Davies et al. | 257/335 |
| 5,719,422 A | 2/1998 | Burr et al. | |
| 5,726,488 A | 3/1998 | Watanabe et al. | |
| 5,726,562 A | 3/1998 | Mizuno | |
| 5,731,626 A | 3/1998 | Eaglesham et al. | |
| 5,736,419 A | 4/1998 | Naem | |
| 5,753,555 A | 5/1998 | Hada | |
| 5,754,826 A | 5/1998 | Gamal et al. | |
| 5,756,365 A | 5/1998 | Kakumu | |
| 5,763,921 A | 6/1998 | Okumura et al. | |
| 5,780,899 A | 7/1998 | Hu et al. | |
| 5,847,419 A | 12/1998 | Imai et al. | |
| 5,856,003 A | 1/1999 | Chiu | |
| 5,861,334 A | 1/1999 | Rho | |
| 5,877,049 A | 3/1999 | Liu et al. | |
| 5,885,876 A | 3/1999 | Dennen | |
| 5,889,315 A | 3/1999 | Farrenkopf et al. | |
| 5,895,954 A | 4/1999 | Yasumura et al. | |
| 5,899,714 A | 5/1999 | Farremkopf et al. | |
| 5,918,129 A | 6/1999 | Fulford, Jr. et al. | |
| 5,923,067 A | 7/1999 | Voldman | |
| 5,923,987 A | 7/1999 | Burr | |
| 5,936,868 A | 8/1999 | Hall | |
| 5,946,214 A | 8/1999 | Heavlin et al. | |
| 5,985,705 A | 11/1999 | Seliskar | |
| 5,989,963 A | 11/1999 | Luning et al. | |
| 6,001,695 A | 12/1999 | Wu | |
| 6,020,227 A | 2/2000 | Bulucea | |
| 6,043,139 A | 3/2000 | Eaglesham et al. | |
| 6,060,345 A | 5/2000 | Hause et al. | |
| 6,060,364 A | 5/2000 | Maszara et al. | |
| 6,066,533 A | 5/2000 | Yu | |
| 6,072,217 A | 6/2000 | Burr | |
| 6,087,210 A | 7/2000 | Sohn | |
| 6,087,691 A | 7/2000 | Hamamoto | |
| 6,088,518 A | 7/2000 | Hsu | |
| 6,091,286 A | 7/2000 | Blauschild | |
| 6,096,611 A | 8/2000 | Wu | |
| 6,103,562 A | 8/2000 | Son et al. | |
| 6,121,153 A | 9/2000 | Kikkawa | |
| 6,147,383 A | 11/2000 | Kuroda | |
| 6,153,920 A | 11/2000 | Gossmann et al. | |
| 6,157,073 A | 12/2000 | Lehongres | |
| 6,175,582 B1 | 1/2001 | Naito et al. | |
| 6,184,112 B1 | 2/2001 | Maszara et al. | |
| 6,190,979 B1 | 2/2001 | Radens et al. | |
| 6,194,259 B1 | 2/2001 | Nayak et al. | |
| 6,198,157 B1 | 3/2001 | Ishida et al. | |
| 6,218,892 B1 | 4/2001 | Soumyanath et al. | |
| 6,218,895 B1 | 4/2001 | De et al. | |
| 6,221,724 B1 | 4/2001 | Yu et al. | |
| 6,229,188 B1 | 5/2001 | Aoki et al. | |
| 6,232,164 B1 | 5/2001 | Tsai et al. | |
| 6,235,597 B1 | 5/2001 | Miles | |
| 6,245,618 B1 | 6/2001 | An et al. | |
| 6,268,640 B1 | 7/2001 | Park et al. | |
| 6,271,070 B2 | 8/2001 | Kotani et al. | |
| 6,271,551 B1 | 8/2001 | Schmitz et al. | |
| 6,288,429 B1 | 9/2001 | Iwata et al. | |
| 6,297,132 B1 | 10/2001 | Zhang et al. | |
| 6,300,177 B1 | 10/2001 | Sundaresan et al. | |
| 6,313,489 B1 | 11/2001 | Letavic et al. | |
| 6,319,799 B1 | 11/2001 | Ouyang et al. | |
| 6,320,222 B1 | 11/2001 | Forbes et al. | |
| 6,323,525 B1 | 11/2001 | Noguchi et al. | |
| 6,326,666 B1 | 12/2001 | Bernstein et al. | |
| 6,335,233 B1 | 1/2002 | Cho et al. | |
| 6,358,806 B1 | 3/2002 | Puchner | |
| 6,380,019 B1 | 4/2002 | Yu et al. | |
| 6,391,752 B1 | 5/2002 | Colinge et al. | |
| 6,426,260 B1 | 7/2002 | Hshieh | |
| 6,426,279 B1 | 7/2002 | Huster et al. | |
| 6,432,754 B1 | 8/2002 | Assaderaghi et al. | |
| 6,444,550 B1 | 9/2002 | Hao et al. | |
| 6,444,551 B1 | 9/2002 | Ku et al. | |
| 6,449,749 B1 | 9/2002 | Stine | |
| 6,461,920 B1 | 10/2002 | Shirahata | |
| 6,461,928 B2 | 10/2002 | Rodder | |
| 6,472,278 B1 | 10/2002 | Marshall et al. | |
| 6,482,714 B1 | 11/2002 | Hieda et al. | |
| 6,489,224 B1 | 12/2002 | Burr | |
| 6,492,232 B1 | 12/2002 | Tang et al. | |
| 6,500,739 B1 | 12/2002 | Wang et al. | |
| 6,503,801 B1 | 1/2003 | Rouse et al. | |
| 6,503,805 B2 | 1/2003 | Wang et al. | |
| 6,506,640 B1 | 1/2003 | Ishida et al. | |
| 6,518,623 B1 | 2/2003 | Oda et al. | |
| 6,521,470 B1 | 2/2003 | Lin et al. | |
| 6,534,373 B1 | 3/2003 | Yu | |
| 6,541,328 B2 | 4/2003 | Whang et al. | |
| 6,541,829 B2 | 4/2003 | Nishinohara et al. | |
| 6,548,842 B1 | 4/2003 | Bulucea et al. | |
| 6,551,885 B1 | 4/2003 | Yu | |
| 6,552,377 B1 | 4/2003 | Yu | |
| 6,573,129 B2 | 6/2003 | Hoke et al. | |
| 6,576,535 B2 | 6/2003 | Drobny et al. | |
| 6,600,200 B1 | 7/2003 | Lustig et al. | |
| 6,620,671 B1 | 9/2003 | Wang et al. | |
| 6,624,488 B1 | 9/2003 | Kim | |
| 6,627,473 B1 | 9/2003 | Oikawa et al. | |
| 6,630,710 B1 | 10/2003 | Augusto | |
| 6,660,605 B1 | 12/2003 | Liu | |
| 6,662,350 B2 | 12/2003 | Fried et al. | |
| 6,667,200 B2 | 12/2003 | Sohn et al. | |
| 6,670,260 B1 | 12/2003 | Yu et al. | |
| 6,693,333 B1 | 2/2004 | Yu | |
| 6,730,568 B2 | 5/2004 | Sohn | |
| 6,737,724 B2 | 5/2004 | Hieda et al. | |
| 6,743,291 B2 | 6/2004 | Ang et al. | |
| 6,743,684 B2 | 6/2004 | Liu | |
| 6,751,519 B1 | 6/2004 | Satya et al. | |
| 6,753,230 B2 | 6/2004 | Sohn et al. | |
| 6,760,900 B2 | 7/2004 | Rategh et al. | |
| 6,770,944 B2 | 8/2004 | Nishinohara | |
| 6,787,424 B1 | 9/2004 | Yu | |
| 6,797,553 B2 | 9/2004 | Adkisson et al. | |
| 6,797,602 B1 | 9/2004 | Kluth et al. | |
| 6,797,994 B1 | 9/2004 | Hoke et al. | |
| 6,808,004 B2 | 10/2004 | Kamm et al. | |
| 6,808,994 B1 | 10/2004 | Wang | |
| 6,813,750 B2 | 11/2004 | Usami et al. | |
| 6,821,825 B2 | 11/2004 | Todd et al. | |
| 6,821,852 B2 | 11/2004 | Rhodes | |
| 6,822,297 B2 | 11/2004 | Nandakumar et al. | |
| 6,831,292 B2 | 12/2004 | Currie et al. | |
| 6,835,639 B2 | 12/2004 | Rotondaro et al. | |
| 6,852,602 B2 | 2/2005 | Kanzawa et al. | |
| 6,852,603 B2 | 2/2005 | Chakravarthi et al. | |
| 6,881,641 B2 | 4/2005 | Wieczorek et al. | |
| 6,881,987 B2 | 4/2005 | Sohn | |
| 6,891,439 B2 | 5/2005 | Jachne et al. | |
| 6,893,947 B2 | 5/2005 | Martinez et al. | |
| 6,900,519 B2 | 5/2005 | Cantell et al. | |
| 6,901,564 B2 | 5/2005 | Stine et al. | |
| 6,916,698 B2 | 7/2005 | Mocuta et al. | |
| 6,917,237 B1 | 7/2005 | Tschanz et al. | |
| 6,927,463 B2 | 8/2005 | Iwata et al. | |

| | | |
|---|---|---|
| 6,928,128 B1 | 8/2005 | Sidiropoulos |
| 6,930,007 B2 | 8/2005 | Bu et al. |
| 6,930,360 B2 | 8/2005 | Yamauchi et al. |
| 6,957,163 B2 | 10/2005 | Ando |
| 6,963,090 B2 | 11/2005 | Passlack et al. |
| 6,995,397 B2 | 2/2006 | Yamashita et al. |
| 7,002,214 B1 | 2/2006 | Boyd et al. |
| 7,008,836 B2 | 3/2006 | Algotsson et al. |
| 7,013,359 B1 | 3/2006 | Li |
| 7,015,546 B2 | 3/2006 | Herr et al. |
| 7,015,741 B2 | 3/2006 | Tschanz et al. |
| 7,022,559 B2 | 4/2006 | Barnak et al. |
| 7,036,098 B2 | 4/2006 | Eleyan et al. |
| 7,038,258 B2 | 5/2006 | Liu et al. |
| 7,039,881 B2 | 5/2006 | Regan |
| 7,045,456 B2 | 5/2006 | Murto et al. |
| 7,057,216 B2 | 6/2006 | Ouyang et al. |
| 7,061,058 B2 | 6/2006 | Chakravarthi et al. |
| 7,064,039 B2 | 6/2006 | Liu |
| 7,064,399 B2 | 6/2006 | Babcock et al. |
| 7,071,103 B2 | 7/2006 | Chan et al. |
| 7,078,325 B2 | 7/2006 | Curello et al. |
| 7,078,776 B2 | 7/2006 | Nishinohara et al. |
| 7,089,513 B2 | 8/2006 | Bard et al. |
| 7,089,515 B2 | 8/2006 | Hanafi et al. |
| 7,091,093 B1 | 8/2006 | Noda et al. |
| 7,105,399 B1 | 9/2006 | Dakshina-Murthy et al. |
| 7,109,099 B2 | 9/2006 | Tan et al. |
| 7,119,381 B2 | 10/2006 | Passlack |
| 7,122,411 B2 | 10/2006 | Mouli |
| 7,127,687 B1 | 10/2006 | Signore |
| 7,132,323 B2 | 11/2006 | Haensch et al. |
| 7,169,675 B2 | 1/2007 | Tan et al. |
| 7,170,120 B2 | 1/2007 | Datta et al. |
| 7,176,137 B2 | 2/2007 | Perug et al. |
| 7,186,598 B2 | 3/2007 | Yamauchi et al. |
| 7,189,627 B2 | 3/2007 | Wu et al. |
| 7,199,430 B2 | 4/2007 | Babcock et al. |
| 7,202,517 B2 | 4/2007 | Dixit et al. |
| 7,208,354 B2 | 4/2007 | Bauer |
| 7,211,871 B2 | 5/2007 | Cho |
| 7,221,021 B2 | 5/2007 | Wu et al. |
| 7,223,646 B2 | 5/2007 | Miyashita et al. |
| 7,226,833 B2 | 6/2007 | White et al. |
| 7,226,843 B2 | 6/2007 | Weber et al. |
| 7,230,680 B2 | 6/2007 | Fujisawa et al. |
| 7,235,822 B2 | 6/2007 | Li |
| 7,256,639 B1 | 8/2007 | Koniaris et al. |
| 7,259,428 B2 | 8/2007 | Inaba |
| 7,260,562 B2 | 8/2007 | Czajkowski et al. |
| 7,294,877 B2 | 11/2007 | Rueckes et al. |
| 7,297,994 B2 | 11/2007 | Wieczorek et al. |
| 7,301,208 B2 | 11/2007 | Handa et al. |
| 7,304,350 B2 | 12/2007 | Misaki |
| 7,307,471 B2 | 12/2007 | Gammie et al. |
| 7,312,500 B2 | 12/2007 | Miyashita et al. |
| 7,323,754 B2 | 1/2008 | Ema et al. |
| 7,332,439 B2 | 2/2008 | Lindert et al. |
| 7,348,629 B2 | 3/2008 | Chu et al. |
| 7,354,833 B2 | 4/2008 | Liaw |
| 7,380,225 B2 | 5/2008 | Joshi et al. |
| 7,398,497 B2 | 7/2008 | Sato et al. |
| 7,402,207 B1 | 7/2008 | Besser et al. |
| 7,402,872 B2 | 7/2008 | Murthy et al. |
| 7,416,605 B2 | 8/2008 | Zollner et al. |
| 7,427,788 B2 | 9/2008 | Li et al. |
| 7,442,971 B2 | 10/2008 | Wirbeleit et al. |
| 7,449,733 B2 | 11/2008 | Inaba et al. |
| 7,462,908 B2 | 12/2008 | Bol et al. |
| 7,469,164 B2 | 12/2008 | Du-Nour |
| 7,470,593 B2 | 12/2008 | Rouh et al. |
| 7,485,536 B2 | 2/2009 | Jin et al. |
| 7,487,474 B2 | 2/2009 | Ciplickas et al. |
| 7,491,988 B2 | 2/2009 | Tolchinsky et al. |
| 7,494,861 B2 | 2/2009 | Chu et al. |
| 7,496,862 B2 | 2/2009 | Chang et al. |
| 7,496,867 B2 | 2/2009 | Turner et al. |
| 7,498,637 B2 | 3/2009 | Yamaoka et al. |
| 7,501,324 B2 | 3/2009 | Babcock et al. |
| 7,503,020 B2 | 3/2009 | Allen et al. |
| 7,507,999 B2 | 3/2009 | Kusumoto et al. |
| 7,514,766 B2 | 4/2009 | Yoshida |
| 7,521,323 B2 | 4/2009 | Surdeanu et al. |
| 7,531,393 B2 | 5/2009 | Doyle et al. |
| 7,531,836 B2 | 5/2009 | Liu et al. |
| 7,538,364 B2 | 5/2009 | Twynam |
| 7,538,412 B2 | 5/2009 | Schulze et al. |
| 7,562,233 B1 | 7/2009 | Sheng et al. |
| 7,564,105 B2 | 7/2009 | Chi et al. |
| 7,566,600 B2 | 7/2009 | Mouli |
| 7,569,456 B2 | 8/2009 | Ko et al. |
| 7,586,322 B1 | 9/2009 | Xu et al. |
| 7,592,241 B2 | 9/2009 | Takao |
| 7,595,243 B1 | 9/2009 | Bulucea et al. |
| 7,598,142 B2 | 10/2009 | Ranade et al. |
| 7,605,041 B2 | 10/2009 | Ema et al. |
| 7,605,060 B2 | 10/2009 | Meunier-Beillard et al. |
| 7,605,429 B2 | 10/2009 | Berstein et al. |
| 7,608,496 B2 | 10/2009 | Chu |
| 7,615,802 B2 | 11/2009 | Elpelt et al. |
| 7,622,341 B2 | 11/2009 | Chudzik et al. |
| 7,638,380 B2 | 12/2009 | Pearce |
| 7,642,140 B2 | 1/2010 | Bae et al. |
| 7,644,377 B1 | 1/2010 | Saxe et al. |
| 7,645,665 B2 | 1/2010 | Kubo et al. |
| 7,651,920 B2 | 1/2010 | Siprak |
| 7,655,523 B2 | 2/2010 | Babcock et al. |
| 7,673,273 B2 | 3/2010 | Madurawe et al. |
| 7,675,126 B2 | 3/2010 | Cho |
| 7,675,317 B2 | 3/2010 | Perisetty |
| 7,678,638 B2 | 3/2010 | Chu et al. |
| 7,681,628 B2 | 3/2010 | Joshi et al. |
| 7,682,887 B2 | 3/2010 | Dokumaci et al. |
| 7,683,442 B1 | 3/2010 | Burr et al. |
| 7,696,000 B2 | 4/2010 | Liu et al. |
| 7,704,822 B2 | 4/2010 | Jeong |
| 7,704,844 B2 | 4/2010 | Zhu et al. |
| 7,709,828 B2 | 5/2010 | Braithwaite et al. |
| 7,723,750 B2 | 5/2010 | Zhu et al. |
| 7,737,472 B2 | 6/2010 | Kondo et al. |
| 7,741,138 B2 | 6/2010 | Cho |
| 7,741,200 B2 | 6/2010 | Cho et al. |
| 7,745,270 B2 | 6/2010 | Shah et al. |
| 7,750,374 B2 | 7/2010 | Capasso et al. |
| 7,750,381 B2 | 7/2010 | Hokazono et al. |
| 7,750,405 B2 | 7/2010 | Nowak |
| 7,750,682 B2 | 7/2010 | Bernstein et al. |
| 7,755,144 B2 | 7/2010 | Li et al. |
| 7,755,146 B2 | 7/2010 | Helm et al. |
| 7,759,206 B2 | 7/2010 | Luo et al. |
| 7,759,714 B2 | 7/2010 | Itoh et al. |
| 7,761,820 B2 | 7/2010 | Berger et al. |
| 7,795,677 B2 | 9/2010 | Bangsaruntip et al. |
| 7,808,045 B2 | 10/2010 | Kawahara et al. |
| 7,808,410 B2 | 10/2010 | Kim et al. |
| 7,811,873 B2 | 10/2010 | Mochizuki |
| 7,811,881 B2 | 10/2010 | Cheng et al. |
| 7,818,702 B2 | 10/2010 | Mandelman et al. |
| 7,821,066 B2 | 10/2010 | Lebby et al. |
| 7,829,402 B2 | 11/2010 | Matocha et al. |
| 7,831,873 B1 | 11/2010 | Trimberger et al. |
| 7,846,822 B2 | 12/2010 | Seebauer et al. |
| 7,855,118 B2 | 12/2010 | Hoentschel et al. |
| 7,859,013 B2 | 12/2010 | Chen et al. |
| 7,863,163 B2 | 1/2011 | Bauer |
| 7,867,835 B2 | 1/2011 | Lee et al. |
| 7,883,977 B2 | 2/2011 | Babcock et al. |
| 7,888,205 B2 | 2/2011 | Herner et al. |
| 7,888,747 B2 | 2/2011 | Hokazono |
| 7,895,546 B2 | 2/2011 | Lahner et al. |
| 7,897,495 B2 | 3/2011 | Ye et al. |
| 7,906,413 B2 | 3/2011 | Cardone et al. |
| 7,906,813 B2 | 3/2011 | Kato |
| 7,910,419 B2 | 3/2011 | Fenouillet-Beranger et al. |
| 7,919,791 B2 | 4/2011 | Flynn et al. |
| 7,926,018 B2 | 4/2011 | Moroz et al. |
| 7,935,984 B2 | 5/2011 | Nakano |
| 7,941,776 B2 | 5/2011 | Majumder et al. |

| Patent No. | Date | Inventor |
|---|---|---|
| 7,945,800 B2 | 5/2011 | Gomm et al. |
| 7,948,008 B2 | 5/2011 | Liu et al. |
| 7,952,147 B2 | 5/2011 | Ueno et al. |
| 7,960,232 B2 | 6/2011 | King et al. |
| 7,960,238 B2 | 6/2011 | Kohli et al. |
| 7,968,400 B2 | 6/2011 | Cai |
| 7,968,411 B2 | 6/2011 | Williford |
| 7,968,440 B2 | 6/2011 | Seebauer |
| 7,968,459 B2 | 6/2011 | Bedell et al. |
| 7,989,900 B2 | 8/2011 | Haensch et al. |
| 7,994,573 B2 | 8/2011 | Pan |
| 8,004,024 B2 | 8/2011 | Furukawa et al. |
| 8,012,827 B2 | 9/2011 | Yu et al. |
| 8,029,620 B2 | 10/2011 | Kim et al. |
| 8,039,332 B2 | 10/2011 | Bernard et al. |
| 8,046,598 B2 | 10/2011 | Lee |
| 8,048,791 B2 | 11/2011 | Hargrove et al. |
| 8,048,810 B2 | 11/2011 | Tsai et al. |
| 8,051,340 B2 | 11/2011 | Cranford, Jr. et al. |
| 8,053,340 B2 | 11/2011 | Colombeau et al. |
| 8,063,466 B2 | 11/2011 | Kurita |
| 8,067,279 B2 | 11/2011 | Sadra et al. |
| 8,067,280 B2 | 11/2011 | Wang et al. |
| 8,067,302 B2 | 11/2011 | Li |
| 8,076,719 B2 | 12/2011 | Zeng et al. |
| 8,097,529 B2 | 1/2012 | Krull et al. |
| 8,103,983 B2 | 1/2012 | Agarwal et al. |
| 8,105,891 B2 | 1/2012 | Yeh et al. |
| 8,106,424 B2 | 1/2012 | Schruefer |
| 8,106,481 B2 | 1/2012 | Rao |
| 8,110,487 B2 | 2/2012 | Griebenow et al. |
| 8,114,761 B2 | 2/2012 | Mandrekar et al. |
| 8,119,482 B2 | 2/2012 | Bhalla et al. |
| 8,120,069 B2 | 2/2012 | Hynecek |
| 8,129,246 B2 | 3/2012 | Babcock et al. |
| 8,129,797 B2 | 3/2012 | Chen et al. |
| 8,134,159 B2 | 3/2012 | Hokazono |
| 8,143,120 B2 | 3/2012 | Kerr et al. |
| 8,143,124 B2 | 3/2012 | Challa et al. |
| 8,143,678 B2 | 3/2012 | Kim et al. |
| 8,148,774 B2 | 4/2012 | Mori et al. |
| 8,163,619 B2 | 4/2012 | Yang et al. |
| 8,169,002 B2 | 5/2012 | Chang et al. |
| 8,170,857 B2 | 5/2012 | Joshi et al. |
| 8,173,499 B2 | 5/2012 | Chung et al. |
| 8,173,502 B2 | 5/2012 | Yan et al. |
| 8,176,461 B1 | 5/2012 | Trimberger |
| 8,178,430 B2 | 5/2012 | Kim et al. |
| 8,179,530 B2 | 5/2012 | Levy et al. |
| 8,183,096 B2 | 5/2012 | Wirbeleit |
| 8,183,107 B2 | 5/2012 | Mathur et al. |
| 8,185,865 B2 | 5/2012 | Gupta et al. |
| 8,187,959 B2 | 5/2012 | Pawlak et al. |
| 8,188,542 B2 | 5/2012 | Yoo et al. |
| 8,196,545 B2 | 6/2012 | Kurosawa |
| 8,201,122 B2 | 6/2012 | Dewey, III et al. |
| 8,214,190 B2 | 7/2012 | Joshi et al. |
| 8,217,423 B2 | 7/2012 | Liu et al. |
| 8,225,255 B2 | 7/2012 | Ouyang et al. |
| 8,227,307 B2 | 7/2012 | Chen et al. |
| 8,236,661 B2 | 8/2012 | Dennard et al. |
| 8,239,803 B2 | 8/2012 | Kobayashi |
| 8,247,300 B2 | 8/2012 | Babcock et al. |
| 8,255,843 B2 | 8/2012 | Chen et al. |
| 8,258,026 B2 | 9/2012 | Bulucea |
| 8,266,567 B2 | 9/2012 | El Yahyaoui et al. |
| 8,286,180 B2 | 10/2012 | Foo |
| 8,288,798 B2 | 10/2012 | Passlack |
| 8,299,562 B2 | 10/2012 | Li et al. |
| 8,324,059 B2 | 12/2012 | Guo et al. |
| 2001/0014495 A1 | 8/2001 | Yu |
| 2002/0042184 A1 | 4/2002 | Nandakumar et al. |
| 2003/0006415 A1 | 1/2003 | Yokogawa et al. |
| 2003/0047763 A1 | 3/2003 | Hieda et al. |
| 2003/0122203 A1 | 7/2003 | Nishinohara |
| 2003/0173626 A1 | 9/2003 | Burr |
| 2003/0183856 A1 | 10/2003 | Wieczorek |
| 2003/0215992 A1 | 11/2003 | Sohn et al. |
| 2004/0075118 A1 | 4/2004 | Heinemann et al. |
| 2004/0075143 A1 | 4/2004 | Bae et al. |
| 2004/0084731 A1 | 5/2004 | Matsuda et al. |
| 2004/0087090 A1* | 5/2004 | Grudowski et al. .......... 438/275 |
| 2004/0126947 A1 | 7/2004 | Sohn |
| 2004/0175893 A1 | 9/2004 | Vatus et al. |
| 2004/0180488 A1 | 9/2004 | Lee |
| 2005/0106824 A1 | 5/2005 | Alberto et al. |
| 2005/0116282 A1 | 6/2005 | Pattanayak et al. |
| 2005/0250289 A1 | 11/2005 | Babcock et al. |
| 2005/0280075 A1 | 12/2005 | Ema et al. |
| 2006/0022270 A1 | 2/2006 | Boyd et al. |
| 2006/0049464 A1 | 3/2006 | Rao |
| 2006/0068555 A1 | 3/2006 | Zhu et al. |
| 2006/0068586 A1 | 3/2006 | Pain |
| 2006/0071278 A1 | 4/2006 | Takao |
| 2006/0154428 A1 | 7/2006 | Dokumaci |
| 2006/0197158 A1 | 9/2006 | Babcock et al. |
| 2006/0203581 A1 | 9/2006 | Joshi et al. |
| 2006/0220114 A1 | 10/2006 | Miyashita et al. |
| 2006/0223248 A1 | 10/2006 | Venugopal et al. |
| 2007/0040222 A1 | 2/2007 | Van Camp et al. |
| 2007/0117326 A1 | 5/2007 | Tan et al. |
| 2007/0158790 A1 | 7/2007 | Rao |
| 2007/0212861 A1 | 9/2007 | Chidambarrao et al. |
| 2007/0238253 A1 | 10/2007 | Tucker |
| 2008/0067589 A1 | 3/2008 | Ito et al. |
| 2008/0108208 A1 | 5/2008 | Arevalo et al. |
| 2008/0169493 A1 | 7/2008 | Lee et al. |
| 2008/0169516 A1 | 7/2008 | Chung |
| 2008/0197439 A1 | 8/2008 | Goerlach et al. |
| 2008/0227250 A1 | 9/2008 | Ranade et al. |
| 2008/0237661 A1 | 10/2008 | Ranade et al. |
| 2008/0258198 A1 | 10/2008 | Bojarczuk et al. |
| 2008/0272409 A1 | 11/2008 | Sonkusale et al. |
| 2009/0057746 A1 | 3/2009 | Sugll et al. |
| 2009/0108350 A1 | 4/2009 | Cai et al. |
| 2009/0134468 A1 | 5/2009 | Tsuchiya et al. |
| 2009/0224319 A1 | 9/2009 | Kohli |
| 2009/0302388 A1 | 12/2009 | Cai et al. |
| 2009/0309140 A1 | 12/2009 | Khamankar et al. |
| 2009/0311837 A1 | 12/2009 | Kapoor |
| 2009/0321849 A1 | 12/2009 | Miyamura et al. |
| 2010/0012988 A1 | 1/2010 | Yang et al. |
| 2010/0038724 A1 | 2/2010 | Anderson et al. |
| 2010/0100856 A1 | 4/2010 | Mittal |
| 2010/0148153 A1 | 6/2010 | Hudait et al. |
| 2010/0149854 A1 | 6/2010 | Vora |
| 2010/0187641 A1 | 7/2010 | Zhu et al. |
| 2010/0207182 A1 | 8/2010 | Paschal |
| 2010/0270600 A1 | 10/2010 | Inukai et al. |
| 2011/0059588 A1 | 3/2011 | Kang |
| 2011/0073961 A1 | 3/2011 | Dennard et al. |
| 2011/0074498 A1* | 3/2011 | Thompson et al. .......... 327/543 |
| 2011/0079860 A1 | 4/2011 | Verhulst |
| 2011/0079861 A1 | 4/2011 | Shifren et al. |
| 2011/0095811 A1 | 4/2011 | Chi et al. |
| 2011/0147828 A1 | 6/2011 | Murthy et al. |
| 2011/0169082 A1 | 7/2011 | Zhu et al. |
| 2011/0175170 A1 | 7/2011 | Wang et al. |
| 2011/0180880 A1 | 7/2011 | Chudzik et al. |
| 2011/0193164 A1 | 8/2011 | Zhu |
| 2011/0212590 A1 | 9/2011 | Wu et al. |
| 2011/0230039 A1 | 9/2011 | Mowry et al. |
| 2011/0242921 A1 | 10/2011 | Tran et al. |
| 2011/0248352 A1 | 10/2011 | Shifren |
| 2011/0294278 A1 | 12/2011 | Eguchi et al. |
| 2011/0309447 A1 | 12/2011 | Arghavani et al. |
| 2012/0021594 A1 | 1/2012 | Gurtej et al. |
| 2012/0034745 A1 | 2/2012 | Colombeau et al. |
| 2012/0056275 A1 | 3/2012 | Cai et al. |
| 2012/0065920 A1 | 3/2012 | Nagumo et al. |
| 2012/0108050 A1 | 5/2012 | Chen et al. |
| 2012/0132998 A1* | 5/2012 | Kwon et al. ................ 257/369 |
| 2012/0138953 A1 | 6/2012 | Cai et al. |
| 2012/0146155 A1 | 6/2012 | Hoentschel et al. |
| 2012/0167025 A1 | 6/2012 | Gillespie et al. |
| 2012/0187491 A1 | 7/2012 | Zhu et al. |
| 2012/0190177 A1 | 7/2012 | Kim et al. |
| 2012/0223363 A1 | 9/2012 | Kronholz et al. |

FOREIGN PATENT DOCUMENTS

| | | |
|---|---|---|
| EP | 0531621 | 3/1993 |
| EP | 0683515 | 11/1995 |
| EP | 0889502 | 1/1999 |
| EP | 1450394 | 8/2004 |
| JP | 59193066 | 11/1984 |
| JP | 4186774 | 7/1992 |
| JP | 8153873 | 6/1996 |
| JP | 8288508 | 11/1996 |
| JP | 2004087671 | 3/2004 |
| KR | 794094 | 1/2008 |
| WO | WO2011/062788 | 5/2011 |

OTHER PUBLICATIONS

Samsudin, K et al., "Integrating Intrinsic Parameter Fluctuation Description into BSIMSOI to Forecast sub-15nm UTB SOI based 6T SRAM Operation", Solid-State Electronics (50), pp. 86-93, 2006.

Wong, H et al., "Nanoscale CMOS", Proceedings of the IEEE, Vo. 87, No. 4, pp. 537-570, Apr. 1999.

Lavéant, P. "Incorporation, Diffusion and Agglomeration of Carbon in Silicon", Solid State Phenomena, vols. 82-84, pp. 189-194, 2002.

Noda, K et al., "A 0.1-μm Delta-Doped MOSFET Fabricated with Post-Low-Energy Implanting Selective Epitaxy" IEEE Transactions on Electron Devices, vol. 45, No. 4, pp. 809-814, Apr. 1998.

Ohguro, T et al., "An 0.18-μm CMOS for Mixed Digital and Analog Aplications with Zero-Volt-Vth Epitaxial-Channel MOSFET's", IEEE Transactions on Electron Devices, vol. 46, No. 7, pp. 1378-1383, Jul. 1999.

Pinacho, R et al., "Carbon in Silicon: Modeling of Diffusion and Clustering Mechanisms", Journal of Applied Physics, vol. 92, No. 3, pp. 1582-1588, Aug. 2002.

Robertson, LS et al., "The Effect of Impurities on Diffusion and Activation of Ion Implanted Boron in Silicon", Mat. Res. Soc. Symp. vol. 610, 2000.

Scholz, R et al., "Carbon-Induced Undersaturation of Silicon Self-Interstitials", Appl. Phys. Lett. 72(2), pp. 200-202, Jan. 1998.

Scholz, RF et al., "The Contribution of Vacancies to Carbon Out-Diffusion in Silicon", Appl. Phys. Lett., vol. 74, No. 3, pp. 392-394, Jan. 1999.

Stolk, PA et al., "Physical Mechanisms of Transient Enhanced Dopant Diffusion in Ion-Implanted Silicon", J. Appl. Phys. 81(9), pp. 6031-6050, May 1997.

Thompson, S et al., "MOS Scaling: Transistor Challenges for the 21st Century", Intel Technology Journal Q3' 1998, pp. 1-19, 1998.

Wann, C. et al., "Channel Profile Optimization and Device Design for Low-Power High-Performance Dynamic-Threshold MOSFET", IEDM 96, pp. 113-116, 1996.

Werner, P. et al., "Carbon Diffusion in Silicon", Applied Physics Letters, vol. 73, No. 17, pp. 2465-2467, Oct. 1998.

Yan, Ran-Hong et al., "Scaling the Si MOSFET: From Bulk to SOI to Bulk", IEEE Transactions on Electron Devices, vol. 39, No. 7, Jul. 1992.

Abiko, H et al., "A Channel Engineering Combined with Channel Epitaxy Optimization and TED Suppression for 0.15μm n-n Gate CMOS Technology", 1995 Symposium on VLSI Technology Digest of Technical Papers, pp. 23-24, 1995.

Chau, R et al., "A 50nm Depleted-Substrate CMOS Transistor (DST)", Electron Device Meeting 2001, IEDM Technical Digest, IEEE International, pp. 29.1.1-29.1.4, 2001.

Ducroquet, F et al. "Fully Depleted Silicon-On-Insulator nMOSFETs with Tensile Strained High Carbon Content $Si_{1-y}C_y$ Channel", ECS 210th Meeting, Abstract 1033, 2006.

Ernst, T et al., "Nanoscaled MOSFET Transistors on Strained Si, SiGe, Ge Layers: Some Integration and Electrical Properties Features", ECS Trans. 2006, vol. 3, Issue 7, pp. 947-961, 2006.

Goesele, U et al., Diffusion Engineering by Carbon in Silicon, Mat. Res. Soc. Symp. vol. 610, 2000.

Hokazono, A et al., "Steep Channel & Halo Profiles Utilizing Boron-Diffusion-Barrier Layers (Si:C) for 32 nm Node and Beyond", 2008 Symposium on VLSI Technology Digest of Technical Papers, pp. 112-113, 2008.

Hokazono, A et al., "Steep Channel Profiles in n/pMOS Controlled by Boron-Doped Si:C Layers for Continual Bulk-CMOS Scaling", IEDM09-676 Symposium, pp. 29.1.1-29.1.4, 2009.

Holland, OW and Thomas, DK "A Method to Improve Activation of Implanted Dopants in SiC", Oak Ridge National Laboratory, Oak Ridge, TN, 2001.

Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", IEDM 96, pp. 459-462, 1996.

US 7,011,991, 03/14/2006, Li (withdrawn).

Hori, et al. A 0.1μm CMOS with a Step Channel Profile Formed by Ultra High Vacuum CVD and In-Situ Doped Ions, pp. 6.8.1-6.8.3, May 12, 1993.

PCT Notification of Transmittal of the International Search Report and the Written Opinion of the International Searching Authority, or the Declaration, International Application No. PCT/US2011/062495, 9 pages, Oct. 26, 2012.

Banerjee, et al. "Compensating Non-Optical Effects using Electrically-Driven Optical Proximity Correction", Proc. of SPIE vol. 7275 72750E, 2009.

Cheng, et al. "Extremely Thin SOI (ETSOI) CMOS with Record Low Variability for Low Power System-on-Chip Applications", Electron Devices Meeting (IEDM), Dec. 2009.

Cheng, et al. "Fully Depleted Extremely Thin SOI Technology Fabricated by a Novel Integration Scheme Feturing Implant-Free, Zero-Silicon-Loss, and Faceted Raised Source/Drain", Symposium on VLSI Technology Digest of Technical Papers, pp. 212-213, 2009.

Drennan, et al. "Implications of Proximity Effects for Analog Design", Custom Integrated Circuits Conference, pp. 169-176, Sep. 2006.

Hook, et al. "Lateral Ion Implant Straggle and Mask Proximity Effect", IEEE Transactions on Electron Devices, vol. 50, No. 9, pp. 1946-1951, Sep. 2003.

Matshuashi, et al. "High-Performance Double-Layer Epitaxial-Channel PMOSFET Compatible with a Single Gate CMOSFET", Symposium on VLSI Technology Digest of Technical Papers, pp. 36-37, 1996.

Shao, et al., "Boron Diffusion in Silicon: The Anomalies and Control by Point Defect Engineering", Materials Science and Engineering R: Reports, vol. 42, No. 3-4, pp. 65-114, Nov. 1, 2003, Nov. 2012.

Sheu, et al. "Modeling the Well-Edge Proximity Effect in Highly Scaled MOSFETs", IEEE Transactions on Electron Devices, vol. 53, No. 11, pp. 2792-2798, Nov. 2006.

\* cited by examiner

Prior Art

SOURCE/DRAIN EXTENSION CONTROL FOR ADVANCED TRANSISTORS

FIELD OF THE INVENTION

This disclosure relates to structures and processes for forming advanced transistors with improved operational characteristics, the structures including improved channel, source/drain extensions, gate spacers, or reduced channel dopant contamination, and integrated circuits and systems containing the same.

BACKGROUND OF THE INVENTION

Fitting more transistors onto a single die is desirable to reduce cost of electronics and improve their functional capability. A common strategy employed by semiconductor manufacturers is to simply reduce gate size of a field effect transistor (FET), and proportionally shrink area of the transistor source, drain, and required interconnects between transistors. However, a simple proportional shrink is not always possible because of what are known as "short channel effects." Short channel effects are particularly acute when channel length under a transistor gate is comparable in magnitude to depletion depth of an operating transistor, and can include reduction in threshold voltage, severe surface scattering, drain induced barrier lowering (DIBL), source/drain punch through, and electron mobility issues.

Conventional approaches to mitigating some short channel effects can involve implantation of pocket or halo implants around the source and the drain. Halo implants can be symmetrical or asymmetrical with respect to a transistor source and drain, and typically provide a smoother dopant gradient between a transistor well and the source and drains. Unfortunately, while such implants improve some electrical characteristics such as threshold voltage rolloff and drain induced barrier lowering, the resultant increased channel doping can adversely affect electron mobility and reduce channel transconductance, primarily because of the increased dopant scattering in the channel.

Many semiconductor manufacturers have attempted to reduce short channel effects by employing new transistor types, including fully or partially depleted silicon on insulator (SOI) transistors. SOI transistors are built on a thin layer of silicon that overlies an insulator layer, have an undoped or low doped channel that minimizes short channel effects, and do not require deep well implants for operation. Unfortunately, creating a suitable insulator layer is expensive and difficult to accomplish. Modern SOI technology can use silicon wafers, but tends to require expensive and time consuming additional wafer processing steps to make an insulative silicon oxide layer that extends across the entire wafer below a surface layer of device-quality single-crystal silicon.

One common approach to making such a silicon oxide layer on a silicon wafer involves high dose ion implantation of oxygen and high temperature annealing to form a buried oxide (BOX) layer in a bulk silicon wafer. Alternatively, SOI wafers can be fabricated by bonding a silicon wafer to another silicon wafer (a "handle" wafer) that has an oxide layer on its surface. Both BOX formation and layer transfer, however, tend to be costly manufacturing techniques with a relatively high failure rate. Accordingly, manufacture of SOI transistors is not an economically attractive solution for many leading manufacturers. Factors including cost of transistor redesign to cope with "floating body" effects, the need to develop new SOI specific transistor processes, and other circuit changes is added to SOI wafer costs, render these solutions undesirable in many situations.

Another possible advanced transistor that has been investigated uses multiple gate transistors that, like SOI transistors, minimize short channel effects by having little or no doping in the channel. Commonly known as a finFET (due to a fin-like shaped channel partially surrounded by gates), use of finFET transistors has been proposed for transistors having 28 nanometer or lower transistor gate size. But again, like SOI transistors, while moving to a radically new transistor architecture solves some short channel effect issues, it creates others, often requiring even more significant transistor layout redesign than SOI. Considering the likely need for complex non-planar transistor manufacturing techniques to make a finFET, and the unknown difficulty in creating a new process flow for finFET, manufacturers have been reluctant to invest in semiconductor fabrication facilities capable of making finFETs.

Deeply depleted channel (DDC) transistors that include both a substantially undoped channel and a highly doped, deeply buried, "screening" layer that sets depletion depth of an operating transistor have potential as a cost effective and manufacturable alternative to SOI and finFET transistors. As compared to conventional transistors that use heavily doped channels, the use of an undoped channel can substantially reduce variations in threshold voltage attributable to random dopant fluctuations in the channel. The tight control of threshold voltage variation can also enable transistor designers to reduce transistor operating voltage and/or create transistors that either switch quickly (low threshold voltage transistors) or save power (high threshold voltage transistors) while switching somewhat slower. Unlike SOI transistors, DDC transistor structures and processes tend not to require a BOX or other insulating layer below the channel to have a tight control of threshold voltage; and unlike finFETs, DDC transistors tend not to require an extensive redesign of circuit layout for operation. DDC transistors are described more fully in the following patent applications, owned by Suvolta, Inc., the assignee of this patent application, and incorporated by reference in their entireties: application Ser. No. 12/708,497 entitled "Electronic Devices and Systems, and Methods for Making and Using the Same"; Appl. No. 61/323,255, entitled "Low Power Transistors, Systems, and Process Improvements"; and Appl. No. 61/357,492 entitled "Diverse and Low Power Transistors, Systems, and Process Improvements."

Threshold voltage control, as well as efficient operation of DDC transistors, can require careful attention to undoped channel characteristics, including channel length, depth, and dopant gradient at source/drain contacts with the channel. Unfortunately, traditional techniques for controlling channel spacing and reducing short channel effects can require source/drain extensions (typically formed by out-diffusion under gate spacers) or halo implants to reduce source/drain junction gradients. Source/drain extensions (also known as lightly doped drains—"LDDs") may be created to slightly reduce channel length by extending the source/drain toward each other using low-energy dopant implants of the same dopant type as the source and drain. Halo implants may be created by high angle implants of counterdopants around the source/drain that help prevent overexpansion of the drain depletion region into the transistor channel. Unfortunately, both conventional source/drain extensions and halo implants can cause contamination of a channel with unwanted dopants, reducing or destroying the advantages of the undoped channel or transistors with DDC structures.

The problem of channel dopant contamination can become even more acute when die supporting multiple transistor types or requiring multiple implants are implicated. Multiple implants increase the likelihood of dopant diffusion into the channel, with each implant becoming a potential source of channel contamination. In addition, each separate source/drain extension and halo implant process step can cause silicon erosion of the substrate layer due to a cleaning (ashing) step, and can risks damage to transistor gate dielectric corners due to lateral oxidation. In "system on a chip," microprocessor, or mixed signal processors, as well as many other advanced devices such as memory, FPGA, or analog/digital sensors, dozens of separate source/drain extensions and halo implants are often used in every die, with each implant process step introducing more dopant contaminants, slightly degrading the transistor gate structure, and increasing the risk of transistor failure. Even simple time delays between source/drain extensions and halo implant process steps can cause increased exposure of the gate dielectric layers to oxidation that damages the gate dielectric. While use of silicon nitride "L"-shaped spacers has been suggested to protect gate dielectrics from lateral oxidation "corner" attack during the multiple source/drain extensions and halo implant process steps, the space required to form L spacers typically reduces inter-transistor spacing, and complicates other processing steps such as growth or placement of tensile films or source/drain strain implants.

DETAILED DESCRIPTION OF THE INVENTION

Figure 1:
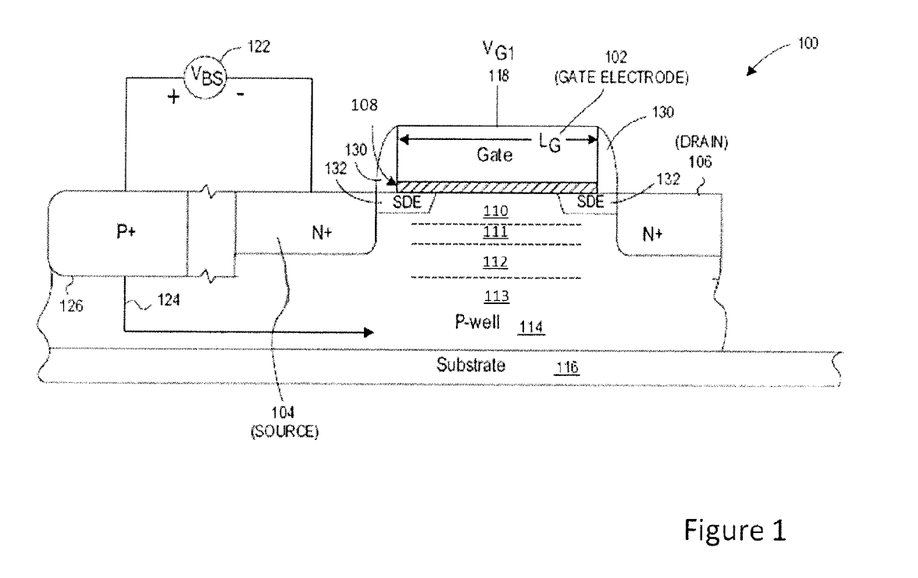
FIG. 1 shows a DDC transistor with source/drain extensions that does not require halo implants.

An improved transistor manufacturable on bulk CMOS substrates is seen in FIG. 1. A Field Effect Transistor (FET) 100 is configured to have greatly reduced short channel effects and decreased variation in threshold voltage due, in part, to minimization of channel dopants. The FET 100 includes a gate electrode 102, source 104, drain 106, and a gate dielectric 108 positioned over a channel 110. In operation, the channel 110 is deeply depleted, forming what can be described as deeply depleted channel (DDC) as compared to conventional transistors, with depletion depth set in part by a highly doped screening region 112. While the channel 110 is substantially undoped, and positioned as illustrated above a highly doped screening region 112, it may include simple or complex layering with different dopant concentrations. This doped layering can include a threshold voltage set region 111 with a dopant concentration less than screening region 112, optionally positioned between the gate dielectric 108 and the screening region 112 in the channel 110. A threshold voltage set region 111 permits small adjustments in operational threshold voltage of the FET 100, while leaving the bulk of the channel 110 substantially undoped. In particular, that portion of the channel 110 adjacent to the gate dielectric 108 should remain undoped. Additionally, a punch through suppression region 113 is formed beneath the screening region 112. Like the threshold voltage set region 111, the punch through suppression region 113 has a dopant concentration less than screening region 112, while being higher than the overall dopant concentration of a lightly doped P-well 114 and substrate 116.

In operation, a bias voltage 122 VBS may be applied to source 104 to further modify operational threshold voltage, and P+ terminal 126 can be connected to P-well 114 at connection 124 to close the circuit. The gate stack includes a gate electrode 102, gate contact 118 and a gate dielectric 108. Gate spacers 130 are included to separate the gate from the source and drain, and implanted source/drain extensions (SDE) 132 extend the source and drain under the gate spacers and gate dielectric 108, reducing the gate length and improving electrical characteristics of FET 100.

In this exemplary embodiment, the FET 100 is shown as an N-channel transistor having a source and drain made of N-type dopant material, formed upon a substrate as P-type doped silicon substrate providing a P-well 114 formed on a substrate 116. However, it will be understood that, with appropriate change to substrate or dopant material, a non-silicon P-type semiconductor transistor formed from other suitable substrates such as Gallium Arsenide based materials may be substituted. The source 104 and drain 106 can be formed using conventional dopant implant processes and materials, and may include, for example, modifications such as stress inducing source/drain structures, raised and/or recessed source/drains, asymmetrically doped, counter-doped or crystal structure modified source/drains, or implant doping of source/drain extension regions according to LDD (low doped drain) techniques. Various other techniques to modify source/drain operational characteristics can also be used, including, in certain embodiments, use of heterogeneous dopant materials as compensation dopants to modify electrical characteristics.

Certain embodiments of the FET 100 omit entirely (or have a very light implant dose) halo implants to a region around the source/drain. Halo implants create a localized, graded dopant distribution near a transistor source and drain that extends into the channel. Halo implants are often required by transistor designers who want to reduce unwanted source/drain leakage conduction or "punch through" current. Unfortunately halo implants tend to introduce dopant contaminants into the channel. These contaminants can shift threshold voltage, increase the variability of threshold voltage between transistors, and decrease mobility and channel transconductance due to the adverse effects of dopant scattering centers in the channel. In addition, halo implants generally require at least two separate processing steps with the die wafer being rotated between different positions (e.g. 0, 90, 180, or 270 degrees), and die with multiple transistor types can even require multiple separate halo implants.

One embodiment of FET 100 supports use of lightly implanted halos with a tightly controlled diffusion spread that minimally impact the channel dopant density, which normally remains below about $5\times10^{17}$ dopant atoms per $cm^3$ adjacent or near the gate dielectric 108. Halo dopant density should be selected to ensure that there is little or no shift in threshold voltage, which is primarily set by the combination of gate electrode 102, threshold voltage set region 111 and screening region 112. In addition, if light halo implants are used, lateral diffusion or migration of dopants from the halo should be controlled to maintain a dopant concentration of less than about $5\times10^{17}$ atoms/$cm^3$ in a channel volume extending between the implanted source/drain extensions 132.

Other embodiments of FET 100 substantially do not use halo implants at all. Such "haloless" transistors and processes cost less to manufacture because halo implant process steps are not required, and eliminate any chance of failure due to misaligned halo implants or unwanted contamination of the undoped channel. Since advanced die manufacturing processes currently require dozens of high angle implants, eliminating or greatly reducing the number of halo implants significantly reduces manufacture time and simplifies die processing. This is especially important for die having gate lengths of 65 nanometers or less (commonly known as a 32 nanometer "node"). With a gate length of 65 nanometers, the channel length between the source and drain is so short that poorly aligned halo implants can easily contaminate the entire channel, greatly decreasing channel mobility and increasing threshold voltage variation. This problem increases as node size is reduced to 45 nm, 32 nm, 28 nm, 22 nm, or even 15 nm, so any process or transistor that requires minimal or no halo implants provides a significant advantage.

The gate electrode 102 can be formed from conventional materials, preferably including, but not limited to, metals, metal alloys, metal nitrides and metal silicides, as well as laminates thereof and composites thereof. In certain embodiments the gate electrode 102 may also be formed from polysilicon, including, for example, highly doped polysilicon and polysilicon-germanium alloy. Metals or metal alloys may include those containing aluminum, titanium, tantalum, or nitrides thereof, including titanium containing compounds such as titanium nitride. Formation of the gate electrode 102 can include silicide methods, chemical vapor deposition methods and physical vapor deposition methods, such as, but not limited to, evaporative methods and sputtering methods. Typically, the gate electrode 102 has an overall thickness from about 1 to about 500 nanometers.

The gate dielectric 108 may include conventional dielectric materials such as oxides, nitrides and oxynitrides. Alternatively, the gate dielectric 108 may include generally higher dielectric constant dielectric materials including, but not limited to hafnium oxides, hafnium silicates, zirconium oxides, lanthanum oxides, titanium oxides, barium-strontium-titanates and lead-zirconate-titanates, metal based dielectric materials, and other materials having dielectric properties. Preferred hafnium-containing oxides include HfO2, HfZrOx, HfSiOx, HfSiOx, HfAlOx, and the like. Depending on composition and available deposition processing equipment, the gate dielectric 108 may be formed by such methods as thermal or plasma oxidation, nitridation methods, chemical vapor deposition methods (including atomic layer deposition methods) and physical vapor deposition methods. In some embodiments, multiple or composite layers, laminates, and compositional mixtures of dielectric materials can be used. For example, a gate dielectric can be formed from a SiO2-based insulator having a thickness between about 0.3 and 1 nm and the hafnium oxide based insulator having a thickness between 0.5 and 4 nm. Typically, the gate dielectric has an overall thickness from about 0.5 to about 5 nanometers.

The channel 110 is formed below the gate dielectric 108 and above the highly doped screening region 112. The channel 110 also contacts and extends between, the source 104 and the drain 106. Preferably, the channel region includes substantially undoped silicon having a dopant concentration less than $5 \times 10^{17}$ dopant atoms per cm³ adjacent or near the gate dielectric 108. Channel thickness can typically range from 5 to 50 nanometers. In certain embodiments the channel 110 is formed by epitaxial growth of pure or substantially pure silicon on the screening region. Alternatively, silicon germanium or other advanced channel material can be used.

The effective length of channel 110 between the source and the drain is somewhat reduced by the source/drain extensions 132 that extend the source 104 and drain 106 under the gate (which includes gate electrode 102 and gate dielectric 108). As shown, the source/drain extensions 132 extend toward each other from the respective source and drains, extending under the gate spacers 130 and under at least a portion of gate dielectric 108. Source/drain extensions are also known as lightly doped drains (LDD) or double diffused drains (DDD) and are typically employed to reduce channel length, to reduce channel hot carriers, and to reduce other short channel effects that adversely affect transistor performance. For improved operation, FET 100 has source/drain extensions that are carefully implanted to provide a desired dopant concentration that is substantially greater than the channel dopant concentration; and the same or less than the source/drain dopant concentration. In certain embodiments, source/drain extensions dopant concentration is selected to be less than one-quarter (¼) the dopant concentration of the source and drain. For best performance, source/drain extensions dopant concentration is generally selected to be between one-quarter and one-twentieth (1/20) the source/drain dopant concentration. After implant, process conditions, including annealing temperatures, are selected to prevent dopant contamination of the channel between the source/drain extensions by diffusion or migration.

Figure 2:
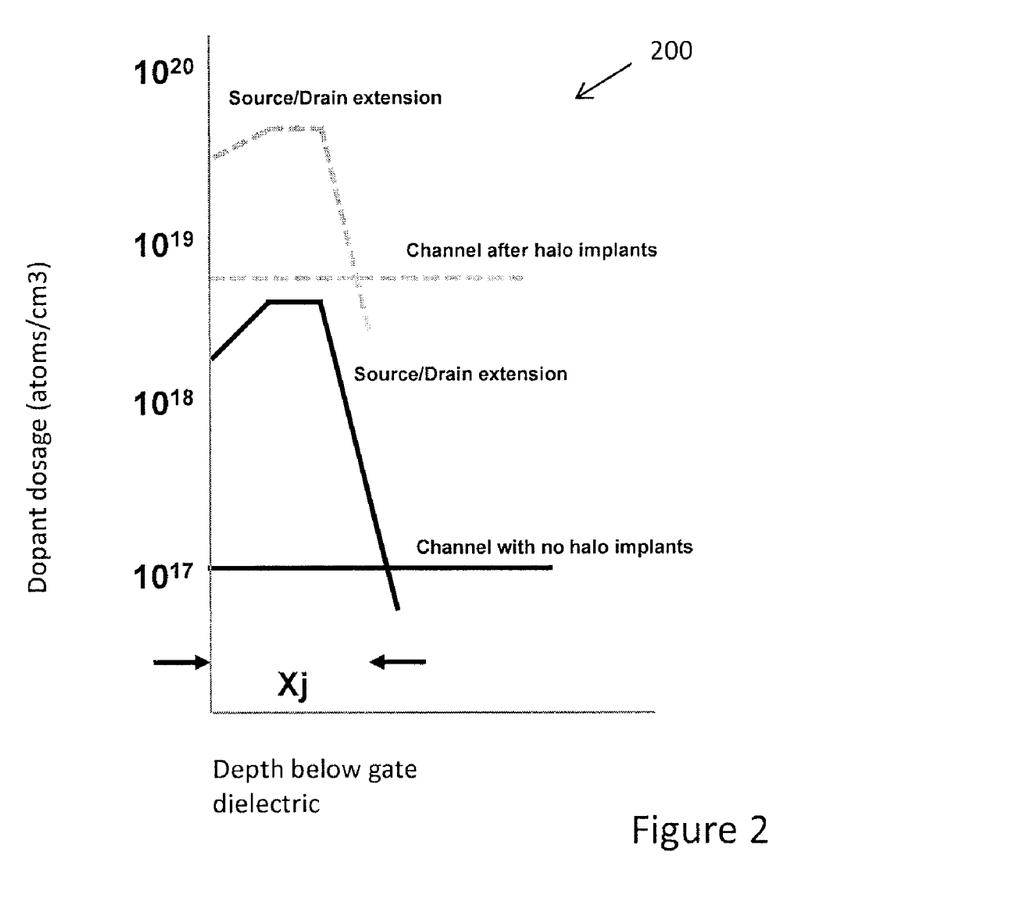
FIG. 2 is a graph illustrating source/drain extension dopant density for a conventional doped channel transistor (dotted line) and DDC transistor (solid line)

Source/drain extension dopant density is difficult to control in transistors because of variations in implant conditions, post-implant diffusion, annealing and dopant activation conditions, and even variations in optional anti-migration techniques such as carbon implant. In a conventional MOSFET, threshold voltage ($V_T$) and statistical measure of threshold voltage variation ($\sigma V_T$) are set by the doping concentration (and the doping concentration variation) in the channel layer. Typically, this $V_T$ "adjust" involves multiple dopant implants directly into or near the channel (e.g. halo implants that result in dopant diffusion into the channel) to yield a post-anneal dopant concentration in the channel that is greater than about $5 \times 10^{18}$ dopant atoms per cm³. Because of this, in the conventional MOSFET, an even higher dose source/drain extension is needed in the channel to properly extend the source/drain. However, such high dose implant causes excess straggle (a statistical measure of the spread of dopants) that increase $\sigma V_T$, and cause high overlap capacitance. Because the DDC channel dopant concentration is about an order of magnitude less than that of the conventional MOSFET, a source/drain extension activation implant used to fabricate a DDC transistor has a dose that that can be more than 10 times lower than that required to fabricate a conventional MOSFET. This is seen in FIG. 2, where a chart 200 compares dopant density of conventional MOSFET source/drain extensions and channel dopant density (dotted lines), with DDC source/drain extensions requiring a greatly reduced source/drain extension and channel dopant density (solid lines). The relative channel versus source/drain extension dopant density is about the same for both transistor types, but the DDC source/drain extensions will have substantially improved $\sigma V_T$, will provide improved contact resistance, and will be less subject to adverse short channel effects.

As further disclosed in FIG. 1, the threshold voltage set region 111 is positioned above screening region 112, and is typically formed as a thin doped region, layer, or plane that, like the source/drain extensions, is processed so that the channel dopant concentration remains low. Instead of conventional channel implants to adjust threshold voltage, DDC transistors rely in part on varying dopant concentration, thickness, and separation from the gate dielectric and the screening region allows for controlled slight adjustments of threshold voltage in the operating FET 100. In certain embodiments, the threshold voltage set region 111 is doped to have a concentration between about $1\times10^{18}$ dopant atoms per cm3 and about $1\times10^{19}$ dopant atoms per cm$^3$. The threshold voltage set region 111 can be formed by several different processes, including 1) in-situ epitaxial doping, 2) epitaxial growth of a thin layer of silicon followed by a tightly controlled dopant implant (e.g. delta doping), 3) epitaxial growth of a thin layer of silicon followed by dopant diffusion of atoms from the screening region 112, or 4) by any combination of these processes (e.g. epitaxial growth of silicon followed by both dopant implant and diffusion from the screening region 112). In certain embodiments, very low channel contamination is possible by use of delta doped planes can be deposited by molecular beam epitaxy, organometallic decomposition, atomic layer deposition or other conventional processing techniques, including chemical or physical vapor deposition. Such delta doped planes can be offset positioned below the substantially undoped channel and above the screening region 112.

As seen in FIG. 1, a highly doped screening region 112 is set below the channel and any threshold voltage set region 111. The screening region 112 in large part sets the depth of the depletion zone of an operating FET 100. Advantageously, the screening region 112 (and associated depletion depth) is set at a depth that ranges from one comparable to the gate length (Lg/1) to a depth that is a large fraction of the gate length (Lg/5). In preferred embodiments, the typical range is between Lg/3 to Lg/1.5. Devices having an Lg/2 or greater are preferred for extremely low power operation, while digital or analog devices operating at higher voltages can often be formed with a screening region between Lg/5 and Lg/2. For example, a transistor having a gate length of 32 nanometers could be formed to have a screening region that has a peak dopant density at a depth below the gate dielectric of about 16 nanometers (Lg/2), along with a threshold voltage set region at peak dopant density at a depth of 8 nanometers (Lg/4).

In certain embodiments, the screening region 112 is doped to have a concentration between about $5\times10^{18}$ dopant atoms per cm3 and about $1\times10^{20}$ dopant atoms per cm$^3$, significantly more than the dopant concentration of the undoped channel, and at least slightly greater than the dopant concentration of the optional threshold voltage set region 111. As will be appreciated, exact dopant concentrations and screening region depths can be modified to improve desired operating characteristics of FET 100, or to take in to account available transistor manufacturing processes and process conditions.

To help control leakage, the punch through suppression region 113 is formed beneath the screening region 112. Typically, the punch through suppression region 113 is formed by direct implant into a lightly doped well, but it be formed by out-diffusion from the screening region, in-situ growth, or other known process. Like the threshold voltage set region 111, the punch through suppression region 113 has a dopant concentration less than the screening region 122, typically set between about $1\times10^{18}$ dopant atoms per cm3 and about $1\times10^{19}$ dopant atoms per cm3. In addition, the punch through suppression region 113 dopant concentration is set higher than the overall dopant concentration of the well substrate. As will be appreciated, exact dopant concentrations and depths can be modified to improve desired operating characteristics of FET 100, or to take in to account available transistor manufacturing processes and process conditions. The ability to precisely set threshold voltage with DDC transistors provides another advantage that simplifies die processing and allows for more compact transistor layouts.

Figure 3:
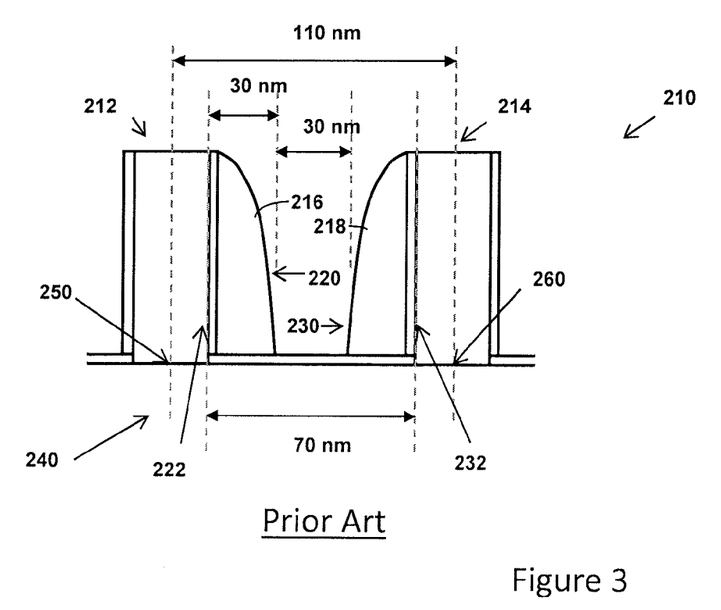
FIG. 3 is a prior art embodiment of a portion of two gates, each having silicon nitride L-spacers.

Complex die supporting multiple device types benefit from other described improvements in transistor layout and processing. This is seen with respect to FIG. 3, which schematically illustrates a partial prior art multi-transistor structure 210 capable of being manufactured in a 28 nm node transistor manufacturing process. Two transistor gate structures 212 and 214 whose centers are separated by about 110 nm and whose opposing edges are separated by about 70 nm is shown. As further shown in FIG. 3, sidewall spacer structures 220 and 230 are respectively disposed along the sidewalls of gate structures 212 and 214, and are in abutting relationship that overlies a transistor substrate 240. To simplify the Figure and for ease of understanding, only spacer structures on opposing sides of the gate structures are shown, but it will be understood that the gate normally supports spacers on each side. In accordance with the prior art, spacer structures 220 and 230 can include thin silicon nitride layers 222 and 232 (with each silicon nitride ($Si_3N_4$) layer being about 5 nm to 15 nm thick) formed in the shape of an L (this is typically referred to in the art as an "L-spacer"). L-spacers are often used in conjunction with transistors requiring multiple source/drain extension implants, and are generally discussed in U.S. Pat. Nos. 6,235,597 and 7,759,206, both assigned to International Business Machines, Inc. Oxide spacers 216 and 218 are disposed on the silicon nitride L-spacers beside gate structures 212 and 214, respectively. As shown in FIG. 3, the distance between spacer structures 220 and 230 along substrate layer 240 (i.e., the spacer-to-spacer opening distance) is only about 30 nm. In addition, as shown in FIG. 3, gate structures 212 and 214 include gate dielectric layers 250 and 260, respectively. Gate dielectric layers must be protected from lateral oxidation during fabrication.

While being manufacturable, prior art spacer architecture such as shown in FIG. 3 is not ideal in applications at the 65 nm semiconductor node and smaller. For example, as indicated above, the spacer-to-spacer opening in a 28 nm node process is only about 30 nm. As a result, there is little room left for an oxide mask needed for epitaxial deposition of silicon germanium (SiGe) to induce strain in the channel of P-type FETs. In practice, for the configuration shown in FIG. 3, the oxide mask for EPI deposition needs a spacing of at least about 25 nm. Further, the L-spacer tends to erode at corners during the many etch and clean steps. As a result, during epitaxial SiGe deposition, SiGe nodules may form at exposed areas, and adversely affect the integrity of electrical connections to gate structures 212 and 214. Further, the spacer architecture shown in FIG. 3 leaves little or no room for further spacers used to provide appropriate source/drain offsets. Further, creating source/drain extensions by implant through the additional material of the L-spacer requires higher energy/dose, which increases straggle and caused increased unwanted variations in source/drain extension dopant positioning, as previously discussed in connection with FIG. 2.

Figure 4:
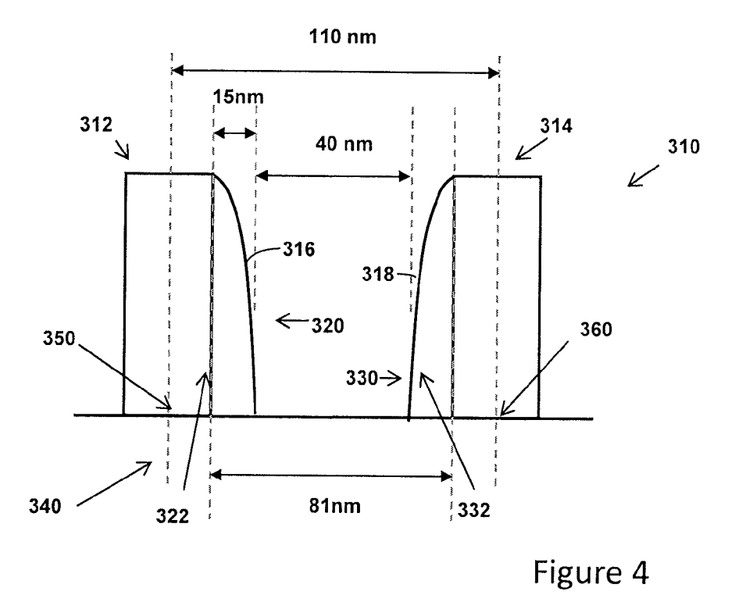
FIG. 4 is an embodiment of a portion of two gates, each having spacers suitable for haloless transistor structures.

In contrast to prior art FIG. 3, a multi-transistor structure 310 such as illustrated in FIG. 4 requires minimal or no halo implants, and can use simplified spacers that allow for greater inter-spacer dimensions. Such a spacer architecture is suitable for multiple transistor integrated circuits fabricated at 32 nm semiconductor technology node devices and smaller (i.e., 28, 22, 15 nm semiconductor technology node devices and so forth). Specifically, such an embodiment relates to spacer architecture for fabricating a CMOS integrated circuit that contains both n-type field effect transistors (NFET or NMOS) and p-type field effect transistors (PFET or PMOS) formed on a single wafer, die, or chip and having closely spaced transistor gates dimensioned to be less than 150 nm between gate centers. In addition, use of a DDC structure allows distinct transistor groupings that have different nominal threshold voltage specifications. Such transistors groupings can be formed from a single source/drain extension implant, or alternatively, allow for the reduction in number of source/drain extension implants (e.g. some number N device types on a die will require N–M number of source/drain extension implants, where M is an integer between 1 and N). In some embodiments, only a single source/drain extension implant is required for all transistor devices on a die, greatly reducing processing costs.

As shown in FIG. 4, semiconductor structure 310 includes two transistor gate structures 312 and 314 whose centers, like that of the transistors shown in FIG. 3, are separated by less than 110 nm. As further shown in FIG. 4, sidewall spacer structures 320 and 330, substantially formed from spacers 316 and 318 (typically composed of nitride or other dielectrics), are respectively disposed along the sidewalls of gate structures 312 and 314, and are in abutting relationship that overlies a transistor substrate 340 without interposition of an L-spacer of silicon nitride or other composition. Gate structures 312 and 314 include gate dielectric layers 350 and 360, respectively.

In contrast to the transistors shown in FIG. 3, the FIG. 4 spacer structures 320 and 330 do not have thin, L-shaped silicon nitride layers. Instead, spacers 316 and 318 are directly disposed on the gate structures 312 and 314, respectively. As shown in FIG. 4, this reduces the spacer distance and greatly improves the distance between spacer structures 320 and 330 along substrate layer 340 (i.e., the spacer-to-spacer opening distance).

Advantageously, spacer structures such as illustrated in FIG. 4 provide sufficient room for a mask, such as an oxide mask, used for selective epitaxial growth of strain layers in source/drain regions. Use of the above-described spacer architecture and reduction and/or elimination of source/drain extensions and halo implant process steps allows manufacture of smaller transistors with improved layout, allows for advanced tensile film placement or source/drain strain engineering, simplifies process flow, and eliminates or greatly decreases failure due to misalignment or incorrect halo implants.

Transistors having a DDC stack can be formed using planar bulk CMOS processing technology available for use at the various standard semiconductor technology nodes. Performance benefits are enhanced for technology nodes where gate length is less than or equal to 65 nanometers, including those at 65 nm, 45 nm, 32 nm, 28 nm, 22 nm and 15 nm, but both larger and smaller nodes can still benefit. While process flows for fabricating a device with NMOS and PMOS transistors having a DDC stack are described in detail in the above-identified patent applications, one embodiment for manufacture of a die including transistors without halo implants, without L-spacers, and with a DDC channel begins with an epitaxial wafer. The wafer can be implanted both with a highly doped screening region and a punchthrough layer below the screening region. In certain embodiments, dopant level of the punch through layer is less than that of the screening region. An epitaxial silicon layer is grown above the screening region, and some defined time during epitaxial growth a delta doped layer is optionally deposited. After anneal and dopant activation, this optional deposited delta doped layer forms a threshold voltage setting region. Alternatively, or in addition, some diffusion from the screening region into the epitaxially deposited silicon layer can be used to aid in forming an offset voltage setting region. Epitaxial growth is continued to provide a substantially undoped channel for transistors that can be isolated from each other by shallow trench isolation. Following transistor isolation, the gate and spacer are fabricated. The source/drain and necessary extensions are formed by high concentration dopant implants, which require covering the substrate in areas in which PMOS devices are to be formed with a photoresist pattern; implanting (source/drain extension implant) low density n-type impurity ions into the substrate in regions where NMOS devices are to be formed; removing the photoresist pattern; covering the substrate in areas in which NMOS devices are to be formed with another photoresist pattern; implanting (source/drain extension implant) low density p-type impurity ions into the substrate in regions where PMOS device are to be formed; and removing the photoresist pattern. Next, spacers are formed, and optional stress layers comprising material suitable to apply a stress to the channel region when applied adjacent to or abutting the channel can be formed. For example, forming a stress layer for PMOS devices requires providing an oxide mask which exposes the source and drain of the PMOS devices while covering the NMOS devices; growing an epitaxial layer of, for example, SiGe; and removing the mask. Contacts and metals are then formed using masks to enable electrical contact with the devices.

Die supporting multiple transistor types, including those with and without DDC dopant structures, with or without punch through suppression, those having different threshold voltages, those with and without threshold voltage being set in part by delta doped threshold voltage structures, and with and without static or dynamic biasing are contemplated. Electronic devices that include the disclosed transistor structures can incorporate die configured to operate as "systems on a chip" (SoC), advanced microprocessors, radio frequency, memory, and other die with one or more digital and analog transistor configurations, and are capable of supporting a wide range of applications, including wireless telephones, communication devices, "smart phones", embedded computers, portable computers, personal computers, servers, and any other electronic device that can benefit from performance improvement. Electronic devices can optionally include both conventional transistors and transistors as disclosed, either on the same die or connected to other die via motherboard, electrical or optical interconnect, stacking or through used of 3D wafer bonding or packaging. According to the methods and processes discussed herein, a system having a variety of combinations of DDC and/or transistor devices, gate and spacer sizes, and strain or other structures can be produced on silicon using planar bulk CMOS processing techniques. In different embodiments, the die may be divided into one or more areas where dynamic bias structures, static bias structures or no-bias structures exist separately or in some combination. In a dynamic bias section, for example, dynamically adjustable devices may exist along with high and low $V_T$ devices and possibly DDC logic devices.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art. Accordingly, the specification and drawings are to be regarded in an illustrative rather than a restrictive sense.

What is claimed is:

1. A method of forming a planar transistor on a semiconductor bulk substrate, comprising the steps of implanting a highly doped screening layer on the semiconductor bulk substrate, the highly doped screening layer having a preselected dopant concentration and thickness;

forming a threshold voltage set region above and in contact with the highly doped screening layer, the threshold voltage set region having a preselected thickness, the threshold voltage set region being co-extensive with the screening layer, the threshold voltage set region having a preselected dopant concentration that is less than the dopant concentration of the highly doped screening layer;

forming a substantially undoped channel on the threshold voltage set region, the substantially undoped channel extending to a source and a drain, the substantially undoped channel being co-extensive with the screening layer and the threshold voltage set region, the substantially undoped channel having a selected thickness, the screening layer and the threshold voltage set region extending to the source and drain;

forming a gate on a transistor substrate;

implanting source/drain extensions into the substantially undoped channel between the source and the drain that have a dopant concentration of less than about $1 \times 10^{19}$ atoms/cm$^3$.

2. A planar transistor having a source and a drain on a semiconductor substrate comprising:
a source;
a drain;
a substantially undoped channel extending to the source and drain;
a threshold voltage set region below the substantially undoped channel, the threshold voltage set region having a thickness, depth, and dopant concentration tailored for a specific threshold voltage, the threshold voltage set region being co-extensive with the undoped channel;
a highly doped screening layer positioned below the threshold voltage set region and the substantially undoped channel and co-extensive therewith, the screening layer having a higher dopant concentration than the threshold voltage set region;
a gate positioned over the substantially undoped channel on a transistor substrate; and
implanted source/drain extensions contacting the source and the drain that respectively extend under the gate, the implanted source/drain extensions having a dopant concentration of less than about $1 \times 10^{19}$ atoms/cm$^3$.

3. A planar transistor having a source and a drain on a semiconductor substrate comprising:
a substantially undoped channel extending to a source having a dopant concentration and drain having a dopant concentration;
a threshold voltage set region below the substantially undoped channel, the threshold voltage set region having a thickness, depth, and dopant concentration tailored for a specific threshold voltage, the threshold voltage set region being co-extensive with the undoped channel;
a highly doped screening layer positioned below the threshold voltage set region and the substantially undoped channel and co-extensive therewith, the screening layer having a higher dopant concentration than the threshold voltage set region;
a gate positioned over the substantially undoped channel on a transistor substrate; and
implanted source/drain extensions contacting the source and the drain that respectively extend under the gate, the implanted source/drain extensions having a dopant concentration of less than one-quarter the dopant concentration of the respective source and drain.

4. The planar transistor of claim 3, wherein the dopant concentration of the implanted source/drain extensions is between one-quarter and one-twentieth of the dopant concentration of the respective source and drain.

5. A method of forming a transistor on a semiconductor substrate comprising the steps of
doping a substrate to adjust threshold voltage to establish a threshold voltage set region that extends laterally to a source and a drain, the threshold voltage set region having a thickness, depth, and dopant concentration tailored for a specific threshold voltage;
growing a substantially undoped channel after formation of the threshold voltage set region, the undoped channel extending to the source and the drain;
implanting a highly doped screening layer below the threshold voltage set region and the substantially undoped channel and coextensive therewith, the screening layer having a higher dopant concentration than the threshold voltage set region;
forming a gate having spacers above the substantially undoped channel;
implanting source/drain extensions into the substantially undoped channel below the spacers and in contact with the source and drain to yield a dopant concentration of less than about $1 \times 10^{19}$ atoms/cm$^3$, while maintaining a dopant concentration of less than about $5 \times 10^{17}$ atoms/cm$^3$ in a channel volume having a depth of at least 5 nanometers below the gate and extending between the implanted source/drain extensions, wherein the implanted source/drain extensions are formed without halo implants.

6. The method of claim 5 further wherein the substantially undoped channel is an epitaxial layer.

7. The method of claim 5 wherein the gate is less than or equal to 65 nanometers in length, and further comprising the step of forming sidewall spacers having a maximum width of less than 20 nanometers.

8. A transistor without halo implants comprising
an undoped channel extending to a source and a drain, with the source and the drain formed without halo implants;
a highly doped screening layer below the undoped channel and coextensive therewith;
a gate above the substantially undoped channel;
implanted source/drain extensions below the gate and extending toward each other from the source and the drain, the implanted source/drain extensions being processed post-implant to maintain a dopant concentration of less than about $5 \times 10^{17}$ atoms/cm$^3$ in a channel volume extending between the implanted source/drain extensions, and wherein the implanted source/drain extensions are formed without halo implants.

9. The transistor of claim 8 further comprising a threshold voltage setting region between the highly doped screening layer and the undoped channel.

10. An electronic device comprising:
a die comprising a transistor having an undoped channel extending to a source and a drain, with the source and the drain formed without halo implants;
a highly doped screening layer below the undoped channel and coextensive therewith;
a gate above the substantially undoped channel, and
implanted source/drain extensions below the gate and extending toward each other from the source and the drain, the implanted source/drain extensions being processed post-implant to maintain a dopant concentration of less than about $5\times10^{17}$ atoms/cm$^3$ in a channel volume extending between the implanted source/drain extensions, and wherein the implanted source/drain extensions are formed without halo implants.

11. A die comprising
a plurality of transistors, with at least one transistor having an undoped channel extending to a source and a drain;
a highly doped screening layer below the undoped channel and coextensive therewith;
a gate above the substantially undoped channel of the at least one transistor; and
implanted source/drain extensions below the gate and extending toward each other from the source and the drain of the at least one transistor, the implanted source/drain extensions being processed post-implant to maintain a dopant concentration of less than about $5\times10^{17}$ atoms/cm$^3$ in a channel volume extending between the implanted source/drain extensions, and wherein the implanted source/drain extensions are substantially formed without halo implants.

* * * * *